(12) United States Patent
Mattos et al.

(10) Patent No.: US 9,455,719 B2
(45) Date of Patent: Sep. 27, 2016

(54) FREQUENCY COMPENSATION (71) Applicant: STMicroelectronics (Research & Development) Limited, Marlow (GB)

(72) Inventors: Philip Mattos, Ruardean Woodside (GB); Peter Bagnall, Bath (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 14/656,395

(22) Filed: Mar. 12, 2015

(65) Prior Publication Data
US 2015/0280718 A1 Oct. 1, 2015

(30) Foreign Application Priority Data

Mar. 31, 2014 (GB) .................... 1405773.1

(51) Int. Cl.
*H03L 1/02* (2006.01)
*H03L 7/24* (2006.01)

(52) U.S. Cl.
CPC ................ *H03L 1/022* (2013.01); *H03L 7/24* (2013.01)

(58) Field of Classification Search
USPC ........................................................ 331/176
See application file for complete search history.

(56) References Cited

U.S. PATENT DOCUMENTS

| 2005/0012561 | A1 | 1/2005 | Young et al. |
| 2006/0132254 | A1* | 6/2006 | Routama ................. H03L 1/025 331/176 |
| 2007/0035353 | A1 | 2/2007 | Chapin et al. |
| 2007/0153944 | A1 | 7/2007 | Kerstenbeck et al. |
| 2013/0293312 | A1 | 11/2013 | Yorita |

FOREIGN PATENT DOCUMENTS

| EP | 2464012 A1 | 6/2012 |
| GB | 2521461 A | 6/2015 |
| WO | 2007/149764 A2 | 12/2007 |

* cited by examiner

*Primary Examiner* — Joseph Chang
(74) *Attorney, Agent, or Firm* — Seed IP Law Group PLLC (57) ABSTRACT

A first oscillator generates a first frequency. A second oscillator generates a second frequency. A controller determines a difference between the first frequency and the second frequency and determines a non-ideal component of the first frequency in dependence on a temperature response of the first and second oscillators.

26 Claims, 5 Drawing Sheets

FREQUENCY COMPENSATION

BACKGROUND

1. Technical Field

The present application relates to determining environmental effects on an oscillator and in particular but not exclusively to determining the deviance of a generated frequency from an ideal due to temperature.

2. Description of the Related Art

Many systems make use of oscillators in order to provide a frequency. In some systems the accuracy of the frequency is important for the correct functioning of the system. One such system is a global navigation satellite system (GNSS).

In order to acquire a received satellite signal, a local signal is generated by a GNSS receiver in order to determine a phase difference with the satellite signal. This phase difference may then be used to determine the position of the receiver with respect to the satellite.

The accuracy of the local signal is important to the functioning of the system. Any frequency error in the locally generated signal leads to an increase in the time taken to acquire the satellite signal as the receiver has to search not only for a phase difference but also potential frequency differences.

Temperature of an oscillator has an effect on the accuracy of the oscillator. The frequency of the oscillator may vary with a change in temperature. In order to address this, many oscillator have built in temperature compensation, for example the temperature controlled crystal oscillator (TXCO), However, such temperature compensation pushes up component price of an oscillator and may increase space required for the oscillator.

BRIEF SUMMARY

In an embodiment, an apparatus comprises: a first oscillator configured to generate a first frequency; a second oscillator configured to generate a second frequency; and a processor configured to: determine a difference between the first frequency and the second frequency; and determine a non-ideal component of the first frequency in dependence on a temperature response of the first and second oscillators.

The temperature response of the first and second oscillator may correspond to a relationship of respective frequencies generated by the first and second oscillators with an operational temperature of the first and second oscillators. The temperature response may comprise a relationship between a difference between the first and second frequencies and the operational temperature of the first and second oscillators.

The first and second oscillators may have respective temperature responses such that at any temperature in an operational temperature range of the apparatus, a difference between the first and second frequencies corresponds to a unique temperature.

The first frequency may comprise an ideal component and the non-ideal component. The second frequency may comprise an ideal component and a non-ideal component.

In an embodiment, an apparatus may include an integrated circuit die.

The integrated circuit die may be configured to compensate the first frequency in dependence on the determined non-ideal component of the first frequency and provide the compensated first frequency to further circuitry.

In an embodiment, the apparatus may be a global satellite navigation system receiver and may further comprise acquisition and tracking circuitry for a received navigation signal.

In an embodiment, a method comprises: generating a first frequency by a first oscillator; generating a second signal by a second oscillator; determining a difference between the first frequency and the second frequency; and determining a non-ideal component of the first frequency in dependence on a temperature response of the first and second oscillators.

In an embodiment, an apparatus comprises: a first oscillator configured to generate a first frequency; a second oscillator configured to generate a second frequency; and control circuitry configured to: determine a difference between the first frequency and the second frequency; and determine a non-ideal component of the first frequency based on a temperature response of the first and second oscillators. In an embodiment, the temperature response of the first and second oscillator corresponds to a relationship of respective frequencies generated by the first and second oscillators with an operational temperature of the first and second oscillators. In an embodiment, the temperature response comprises a relationship between a difference between the first and second frequencies and the operational temperature of the first and second oscillators. In an embodiment, the first and second oscillators have respective temperature responses such that at any temperature in an operational temperature range of the apparatus, a difference between the first and second frequencies corresponds to a unique temperature. In an embodiment, the first frequency comprises an ideal component and the non-ideal component. In an embodiment, the second frequency comprises an ideal component and a non-ideal component. In an embodiment, the control circuitry is configured to adjust the first frequency based on the determined non-ideal component of the first frequency and output the adjusted first frequency.

In an embodiment, a method comprises: generating a first frequency using a first oscillator; generating a second signal using a second oscillator; determining a difference between the first frequency and the second frequency; and determining a non-ideal component of the first frequency based on a temperature response of the first and second oscillators. In an embodiment, the temperature response of the first and second oscillator corresponds to a relationship of respective frequencies generated by the first and second oscillators with an operational temperature of the first and second oscillators. In an embodiment, the temperature response comprises a relationship between a difference between the first and second frequencies and the operational temperature of the first and second oscillators. In an embodiment, the first and second oscillators have respective temperature responses such that at any temperature in an operational temperature range of the apparatus, a difference between the first and second frequencies corresponds to a unique temperature. In an embodiment, the first frequency comprises an ideal component and the non-ideal component. In an embodiment, the second frequency comprises an ideal component and a non-ideal component. In an embodiment, the method comprises: adjusting the first frequency based on the determined non-ideal component of the first frequency.

In an embodiment, a system comprises: a first oscillator configured to generate a first frequency; a second oscillator configured to generate a second frequency; frequency control circuitry configured to: determine a difference between the first frequency and the second frequency; determine a non-ideal component of the first frequency based on a temperature response of the first and second oscillators; and adjust the first frequency based on the determined non-ideal component of the first frequency; and operational circuitry configured to receive the adjusted first frequency. In an embodiment, the temperature response of the first and second oscillator corresponds to a relationship of respective frequencies generated by the first and second oscillators with an operational temperature of the first and second oscillators. In an embodiment, the operational circuitry comprises a global satellite navigation system receiver including acquisition and tracking circuitry configured to receive a navigation signal. In an embodiment, the system comprises an integrated circuit, the integrated circuit including the first oscillator, the second oscillator and the frequency control circuitry. In an embodiment, the integrated circuit comprises the operational circuitry and the operational circuitry includes a global satellite navigation system receiver.

In an embodiment, a non-transitory computer-readable medium's contents configure circuitry to perform a method, the method comprising: determining a difference between a first frequency generated by a first oscillator and a second frequency generated by a second oscillator; and determining a non-ideal component of the first frequency based on a temperature response of the first and second oscillators. In an embodiment, the temperature response of the first and second oscillator corresponds to a relationship of respective frequencies generated by the first and second oscillators with an operational temperature of the first and second oscillators. In an embodiment, the method comprises: adjusting the first frequency based on the determined non-ideal component of the first frequency.

BRIEF DESCRIPTION OF THE SEVERAL VIEWS OF THE DRAWINGS

Example embodiments will now be described with reference to the following figures in which.

DETAILED DESCRIPTION

Figure 1:
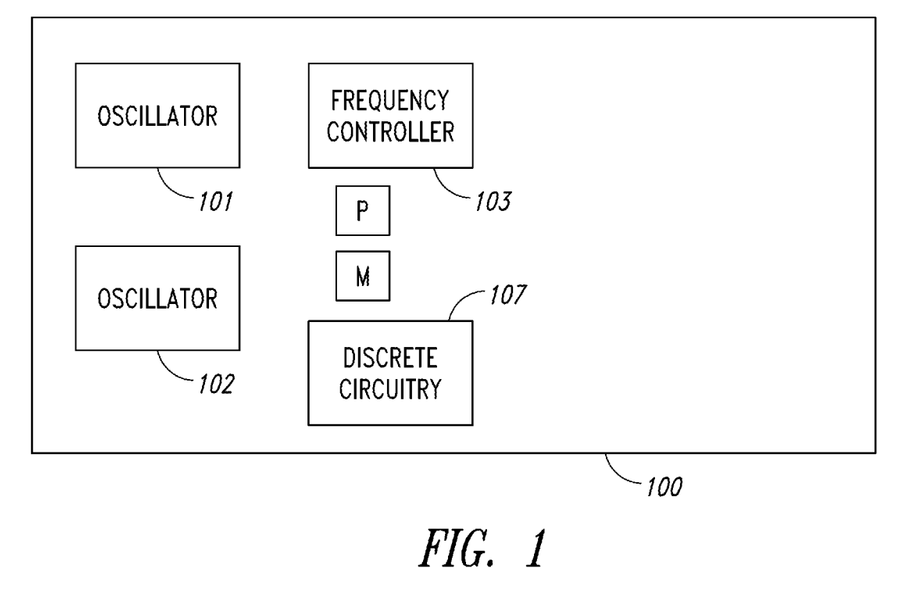
FIG. 1 shows an apparatus in accordance with some embodiments.

FIG. 1 shows an example of an apparatus or system 100 in which embodiments of the present disclosure may be implemented. FIG. 1 comprises a first oscillator 101, a second oscillator 102 and a frequency controller 103. It will be appreciated that FIG. 1 is by way of example and the apparatus may comprise further functional circuitry.

In one example, the apparatus may be a global navigation satellite system (GNSS) receiver such as a global positioning system (GPS) or Galileo receiver and may comprise further circuitry suitable for carrying out the functionality of such a receiver. However it will be appreciated that the apparatus of FIG. 1 may be any apparatus, such as an apparatus in which the accuracy of an oscillator is important. As illustrated, the apparatus 100 of FIG. 1 includes a processor P, a memory M, and discrete circuitry 107, which may be used only or in various combinations to implement some or all of the functions or blocks of the apparatus 100. For example, the processor P may execute instructions stored in the memory M to implement the frequency controller 103, the oscillators 101, 102 may be implemented using discrete circuitry 107, etc., and various combinations thereof.

It will be appreciated that the first oscillator 101 may be configured to generate a first frequency and the second oscillator 102 may be configured to generate a second frequency. The first frequency may comprise an ideal component, namely the frequency the oscillator 101 is expected to or designed to generate. For example the first oscillator 101 may be a crystal oscillator configured to provide a frequency for the acquisition of a GNSS satellite system. In this example the ideal component corresponds to the frequency that is desired for the acquisition of the satellite signal. The ideal component may also be seen as the frequency generated by the oscillator under ideal conditions, for example ideal temperature conditions.

The first frequency may also comprise a non-ideal component. The non-ideal component may be the contribution to the first frequency due to non-ideal conditions of the oscillator. For example the non-ideal component may be a component of the first frequency due to a non-ideal temperature response of the first oscillator 101. The non-ideal component may be considered to be the deviance of the first frequency from the ideal component of the first frequency.

In systems where an accurate frequency is desired, the first frequency may be compensated for the non-ideal component. One method of compensation is to provide the first oscillator 101 as a temperature controlled oscillator. In this example, the oscillator may have a built in temperature measurement and the first frequency may be compensated based on the temperature of the oscillator. However, such components tend to be expensive.

An embodiment, compensates for an oscillator frequency without having to include additional temperature measurement circuitry. Embodiments may determine a non-ideal component of a first frequency based on a temperature response of a first oscillator and a temperature response of a second oscillator. In some embodiments, a relationship between a first and second frequency may indicate a non-ideal component of the first frequency based on a temperature response of the first oscillator.

It will be appreciated that the first frequency generated by the first oscillator 101 may comprise an ideal component and a non-ideal component. Similarly the second frequency generated by the second oscillator 102 may comprise an ideal component and a non-ideal component.

Referring to FIG. 1, the first 101 and second 102 oscillators may have a known relationship between generated frequency and operational temperature of the oscillator. This relationship may for example be based on a mechanical structure of the oscillator, a frequency of the oscillator and/or measurements carried out on the oscillator, for example provided by a manufacturer of the oscillator. The relationship may for example describe a deviance of the oscillator frequency from a reference frequency according to temperature. This relationship may be the temperature response of the oscillator. The relationship may for example be indicative of a relationship between a deviance of a frequency (non-ideal component) to an ideal frequency (ideal component) of the oscillator. This relationship may be considered to be a frequency response of the oscillator.

Figure 2:
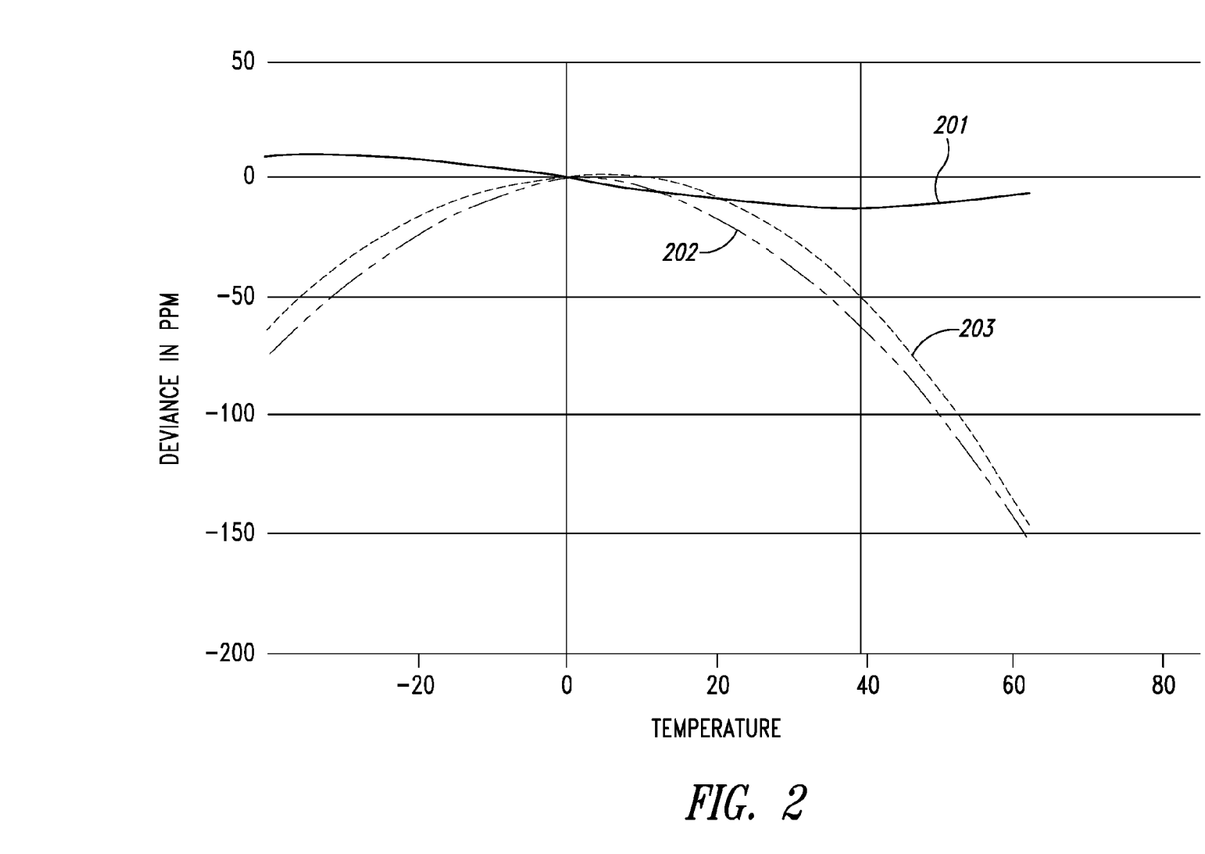
FIG. 2 shows an example of a temperature response of an oscillator.

FIG. 2 shows the temperature response of a first oscillator 201 and a second oscillator 202. The temperature response 201 of the first oscillator may be shown as the difference or deviance between and actual frequency (ideal and non-ideal components) generated by the oscillator and an ideal frequency (ideal component) of the oscillator. The temperature response 202 of the second oscillator may correspond to a difference between the second frequency and a reference signal, for example an ideal frequency of the first oscillator.

Thus the temperature response 202 of the second oscillator may be modelled as a difference between ideal components of the first and second oscillators plus a non-ideal component of the second oscillator.

It will be appreciated that the temperature responses are by way of example only and in some embodiments the temperature response of an oscillator may correspond to a relationship between a non-ideal frequency component of the oscillator with a reference frequency.

The first and second oscillators may have different characteristics which cause their temperature responses to differ.

In this example, the apparatus may be a GNSS receiver and the first oscillator 101 may be used for the acquisition and tracking of a GNSS navigation signal. The second oscillator 102 may be for example a real time clock (RTC) oscillator for the apparatus 100. The oscillators may differ in frequency, for example the first oscillator 101 may generate a frequency of 26 MHz whereas the second oscillator may generate a frequency of 32 kHz. The first and second oscillator may additionally have different mechanical structure which may also cause their temperature responses to differ.

The difference in the temperature response of the first oscillator 201 and the second oscillator 202 may be used to determine a non-ideal component of the first frequency 201. This determination may for example be carried out without the inclusion of temperature measurement circuitry. The non-ideal component of the first frequency may be determined based on a difference between the first frequency and the second frequency.

For example a difference between the first frequency and the second frequency may be shown as follows:

$$f_{osc1} - f_{osc2} = (f_1 - f_2) + (d_1 - d_2) \quad (1)$$

where $f_{osc1}$ and $f_{osc2}$ are the first and second frequencies generated by the first oscillator 101 and the second 102 oscillator respectively;

$f_1$ and $f_2$ are the ideal components of the first and second frequencies respectively; and $d_1$ and $d_2$ are the non-ideal components or deviance of the first and second frequencies respectively.

Referring the graph of FIG. 2 it will be appreciated that the relationship between the non-ideal component ($d_1$) of the first frequency ($f_{osc1}$) and temperature is shown 201 and the relationship between the non-ideal component ($d_2$) of the second frequency ($f_{osc2}$) and temperature is known 202. Thus a relationship between the difference between the first and second frequencies (and non-ideal components thereof) and temperature is known and shown at 203.

In operation, the first and second frequencies comprise non-ideal components as well as ideal components. By modelling a difference between the first and second frequencies against temperature, an operating temperature of the oscillators may be determined. This relationship between the difference between the first and second frequencies and temperature may be determined from 201 and 202. It will be appreciated that 201 and 202 may be based on prior measurements and/or characteristics of the oscillators, for example provided by the manufacturer.

For example, 201 models temperature as a function of the deviance ($d_1$) of the first frequency from the ideal and 202 models temperature as a function of the deviance of the second frequency from the ideal component of the first frequency ($f_2+d_2-f_1$). In combination, these form 203 which models the difference between the second frequency and the first frequency ($f_2-f_1+d_2-d_1$).

From 203, an operational temperature of the first 101 and second 102 oscillators may be determined based on a difference between the second frequency and the first frequency. From this determined temperature, the non-ideal component of the first frequency $d_1$ may be determined. The determined non-ideal component of the first frequency may be used to compensate the first frequency.

It will be appreciated, that in operation of the oscillators, the exact first and second frequencies being generated may not be known due to the unknown non-ideal components. However, a difference between the frequencies may be found and used to determine the deviance of the first frequency.

It will appreciated that the temperature responses of 201 and 202 are by way of example only. In this example the relationships 201 and 202 differ both in shape (for example due to crystal structure) and frequency. However it will be appreciated that the relationships may differ in other manners. Temperature may be determined based on a difference between the first and second frequencies when the temperature response 201 and 202 of the first 101 and second 102 oscillators differ such that a difference in the temperature responses corresponds to an unique temperature in an operating range of temperature, for example when the difference between the first and second frequencies is such that it corresponds to one temperature in an operating range of temperature for the oscillators.

It will be appreciated that the operating range of temperature for the first and second oscillators may correspond to a range of temperatures in which the apparatus is expected to operate. This may for example differ with the functionality of the apparatus. For example if the apparatus is to be implemented in a non-terrestrial environment, an operational temperature range of the apparatus may differ to if it is to be implemented for domestic use.

Figure 3:
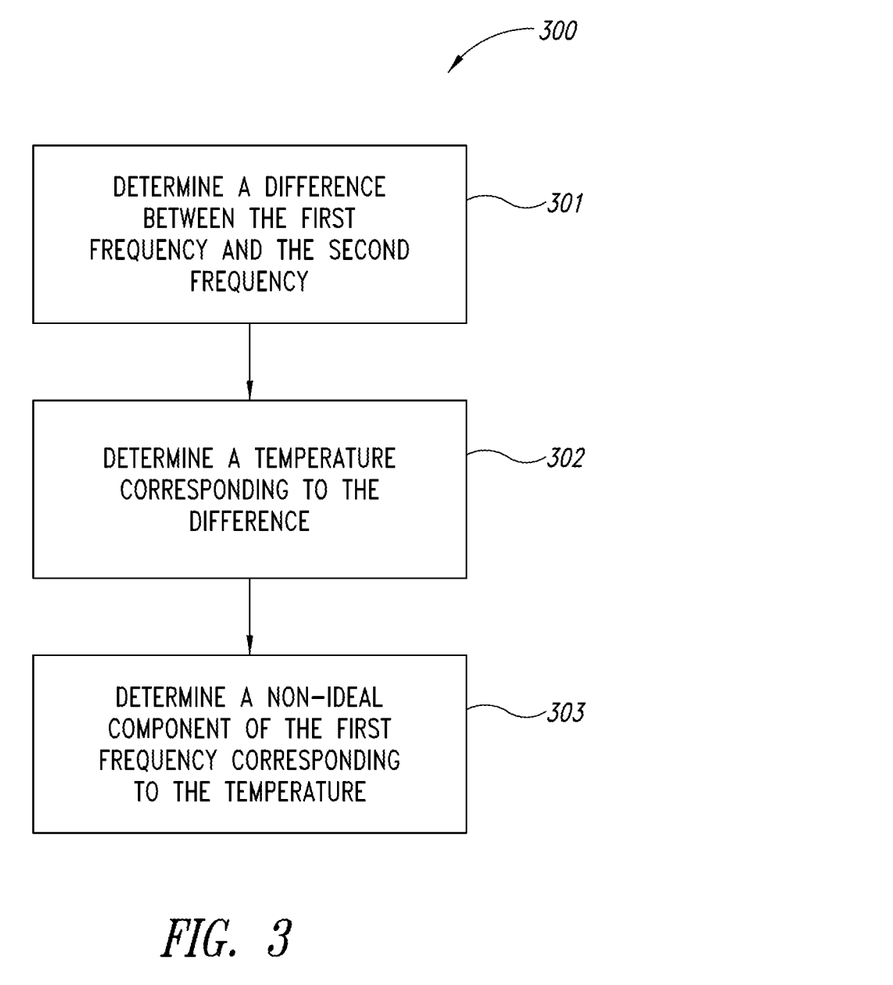
FIG. 3 is a flow diagram depicting an embodiment of a method.

FIG. 3 is a flow diagram showing an example of a method 300 of an embodiment. In some embodiments, the method of FIG. 3 may be carried out by the frequency controller 103.

At 301 in FIG. 3 a difference between a first frequency generated by a first oscillator 101 and a second frequency generated by a second oscillator 102 is determined. The difference may be determined for example by comparing the first frequency generated by the first oscillator and the second frequency generated by the second oscillator. The determined difference may be indicative of an operational temperature of the first and second oscillator.

At 302, the determined difference may be used to determine an operational temperature of the first and second oscillator. The difference may be determined based on a relationship between the difference between the first and second frequencies and temperature.

In some embodiments, the relationship between the difference between the first and second frequencies and temperature may be modelled based on known characteristics of the oscillators. In other or additional embodiments, a temperature response, for example a relationship between a frequency generated by the oscillator and temperature, may be known for each of the first and second oscillators and the relationship between the difference and temperature may be determined therefrom.

In other or additional embodiments a relationship between the difference between the first and second frequencies and a non-ideal frequency component of the first frequency may be modelled. In this case, act 302 is implicitly rather than explicitly carried out as the relationship between the difference between the first and second frequencies and a non-ideal frequency component of the first frequency is determined by the operational temperature of the oscillator.

At 303 a non-ideal component of the first frequency may be determined based on the determined temperature. It will be appreciated that in some embodiments, the non-ideal component will be determined explicitly based on the determined temperature. In other embodiments, for example where a relationship between the difference between the first and second frequencies and a non-ideal frequency component of the first frequency is modelled, the determination of the non-ideal component may be based on the difference between the first frequency and the second frequency and dependent on temperature.

It will be appreciated that while the description of FIG. 3 refers to the difference between the first and second frequency, this may correspond to a difference between the frequencies as a whole or a difference between the non-ideal components of the first and second frequencies.

It will be appreciated that the foregoing has described making determinations on the basis of characteristics of the first 101 and second 102 oscillator. In a first example these characteristics may include a relationship between a difference between the first and second frequency (or non-ideal components thereof) and temperature and a relationship between a non-ideal component of the first frequency and temperature. In a second example, the characteristics may include a relationship between a difference between the first and second frequency (or non-ideal components thereof) and a non-ideal component of the first frequency. It will be appreciated that for both examples, these relationships may be based on the temperature response of the first and second oscillators. For example, the temperature response may be the non-ideal components of the first and second frequencies generated due to temperature.

In some embodiments, a determination of the operational temperature of the oscillators and the determination of the non-ideal frequency component of the first frequency may be made based on models corresponding to the temperature response of the first and second oscillator. These models may for example describe the relationships 201, 202 and 203 in FIG. 2. It will also be appreciated that the models may describe relationships not shown in FIG. 2 but based on similar relationships, for example the relationship between a difference between the first and second frequency and a non-ideal component of the first frequency.

In embodiments, the frequency controller 103 may use the models and/or relationships to determine the non-ideal frequency component of the first frequency.

The foregoing has described a first phase of operation in which the difference between the first and second frequencies is used to determine a non-ideal component and hence a compensation for the first frequency. It will be appreciated, that some embodiments may further comprise a second phase of operation in which the compensated signal is compared to a reference signal and the resulting difference is used to update the model used to determine compensation. For example, an error between the compensated frequency and a frequency corresponding to the ideal component of the first frequency may be determined and used to update the model. It will also be appreciated that in some embodiments, the frequency controller 103 may be configured to update the models or relationships.

Figure 4:
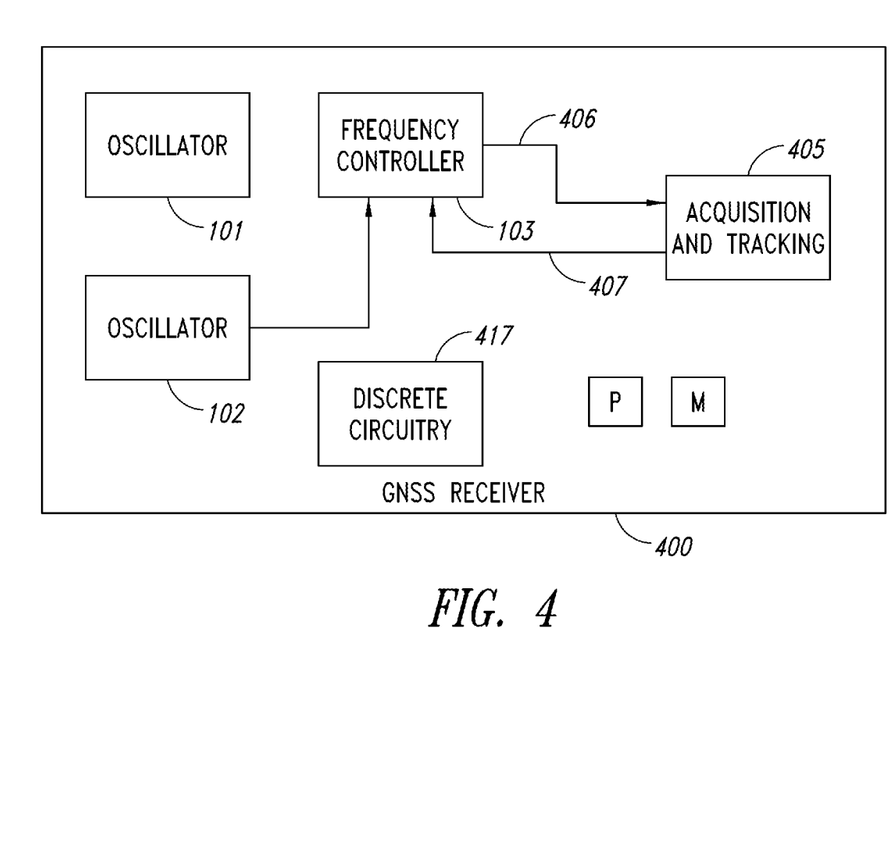
FIG. 4 is an example of a receiver in which embodiments may be implemented.

In this example, the apparatus 100 may be a GNSS controller. FIG. 4 shows an example of a GNSS controller 400 that may update the models used to determine the non-ideal component of the first frequency.

FIG. 4 shows an example of a GNSS receiver 400 including a first oscillator 101, a second oscillator 102 and a frequency controller 103. It will be appreciated that in some embodiments, the frequency controller 103 may be implemented in software. For example, the non-ideal component may be determined in software and at least part of the tracking and acquisition functionality of the receiver 100 may be carried out in software.

FIG. 4 further includes an acquisition and tracking block 404. The acquisition and tracking block 404 may receive a GNSS navigation signal at 405. It will be appreciated that this signal 405 may not be received directly from a transmitter such as a satellite, but may be first processed by other circuitry in or associated with the receiver 400. For example the signal 405 may be down-converted and/or pre-processed for noise.

The frequency controller 103 may receive the first frequency from the first oscillator 101 and the second frequency from the second oscillator 102. The frequency controller 103 may use the first and second frequencies to determine a non-ideal component of the first frequency as described in relation to FIGS. 2 and 3 using one or more models of the temperature response(s) of the first 101 and second 102 oscillators. The frequency controller 103 may further compensate the first frequency based on the determined non-ideal component.

The frequency controller 103 may then provide the compensated frequency 406 to the tracking and acquisition block 404. The compensated frequency 406 may be used in the acquisition and tracking of the GNSS signal.

In addition to compensating the first frequency for the non-ideal component caused by temperature, the frequency controller 103 in some embodiments, may update the models (for example the temperature response(s)) used to determine the non-ideal component of the first frequency. In this embodiment, the frequency controller 103 may update the model(s) based on a frequency offset between the compensated first frequency 406 and an ideal first frequency.

It will be appreciated that the first frequency comprises an ideal component and a non-ideal component. The frequency controller 103 may determine the non-ideal component of the first frequency and then compensate the first frequency for the non-ideal component in order to provide only the ideal component of the first frequency for example to the tracking and acquisition block. In other words, the frequency controller 103 compensates the first frequency to provide a frequency that the oscillator would generate under ideal conditions.

However in some embodiments, the determination of the non-ideal component may not be entirely accurate. This may be for example due to other environmental or manufacturing effects that cause non-ideal behavior of the oscillator other than temperature. In other or further examples, the model giving the temperature response of the first and second oscillators may not be entirely accurate. The frequency controller 103 may therefore update or modify the model(s) in order to provide a more accurate model on which to base its determination. It may do this in response to an offset 407 between the compensated frequency and the ideal frequency of the oscillator (the frequency the oscillator would generate under ideal conditions).

In the example of the GNSS receiver 400, in a first phase of operation, the first oscillator is configured to generate a frequency of a navigation signal 405 received by the GNSS receiver 400. It will be appreciated that due to non-ideal conditions, the first frequency will not match the received navigation signal 405 exactly however the frequency controller may determine an non-ideal component and compensate the first frequency in order to provide a frequency to the tracking and acquisition block that is at least close to the frequency of the received signal. The more accurate the compensated frequency, the quicker the received signal 405 may be acquired.

Once, the tracking and acquisition block 404 has acquired the received signal 405, in a second phase of operation, it may provide an indication of an offset between the compensated frequency and the frequency of the received signal 405. This offset may be indicative of a difference between the frequency of the compensated signal and the frequency of the received signal 405. Based on this offset 407, the frequency controller 103 may update its model(s) to more accurately determine the non-ideal component of the first frequency.

In this example, the frequency of the received signal 405 may be considered to correspond to the ideal component of the first frequency. The determined non-ideal component of the first frequency may not be entirely accurate and an offset 407 between the ideal component (frequency of the received signal 405) and the compensated frequency 406 may indicate a difference between the determined non-ideal component and actual non-ideal component.

In some embodiments the model(s) may correspond to a function, for example a polynomial but not restricted to such, that corresponds to the behavior of the first and second oscillators under different temperature conditions (for example a temperature response). Each of the one or more function(s) may be described by a set of coefficients and these coefficients may be updated based on the offset 407.

The one or more function(s) may for example be implemented in the form of a filter. In the example of a filter, the filter may comprise two aspects. A first aspect may relate to the temperature response of the first and second oscillator. In this case, the filter is used to determine a non-ideal frequency component based on a difference between the first and second frequencies. This determination may be used to apply compensation to the first frequency.

The second mode or aspect of the filter is configured to update coefficients of the filter. An offset 407 may be determined by comparing the compensated frequency with the received frequency. The offset 407 may be used to update the filter coefficients.

As illustrated, the receiver 400 of FIG. 4 includes a processor P, a memory M, and discrete circuitry 417, which may be used only or in various combinations to implement some or all of the functions or blocks of the receiver 400. For example, the processor P may execute instructions stored in the memory M to implement the frequency controller, the acquisition and tracking block, etc., the oscillators 101, 102 may be implemented using discrete circuitry 417, etc., and various combinations thereof.

Figure 5:
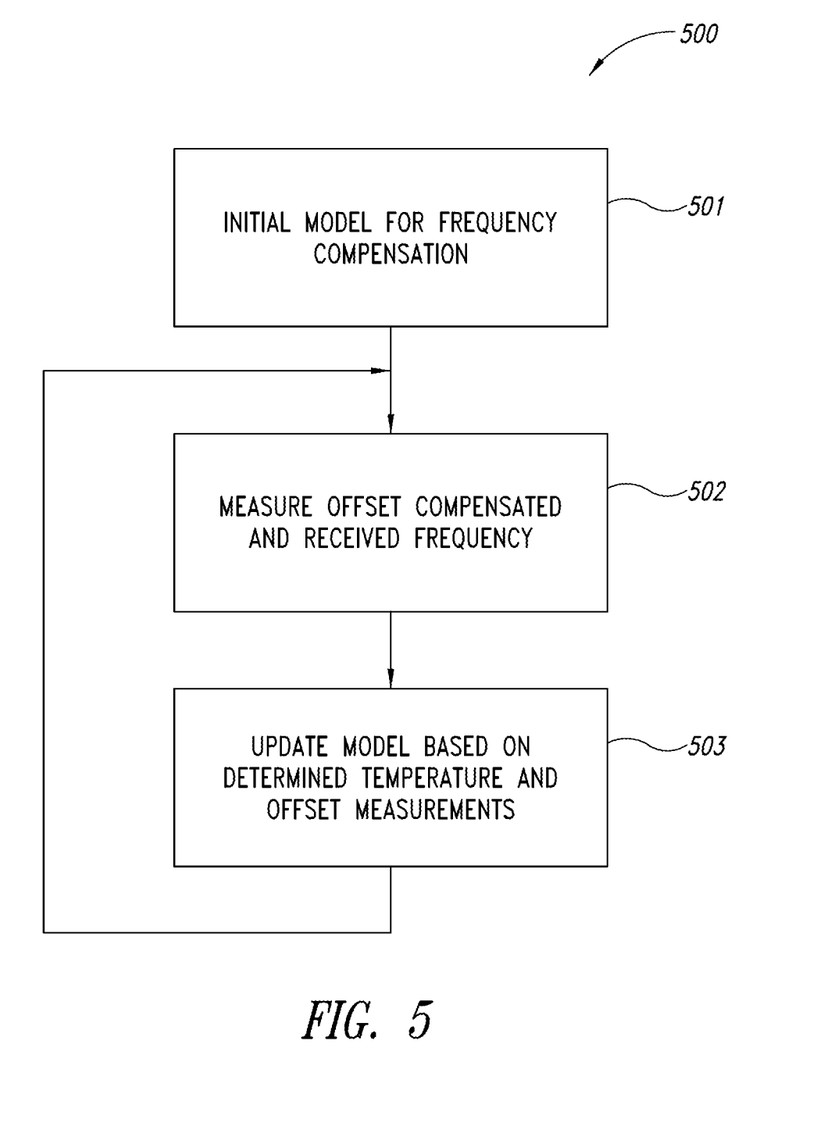
FIG. 5 is a flow diagram depicting an embodiment of a method.

FIG. 5 shows an example of a method 500 that may be carried out to update the model in accordance with some embodiments.

At 501 of FIG. 5, the frequency controller 103 may have an initial model for frequency compensation (for example 203 or a combined model of 201 and 203). It will be appreciated that his initial model may be generated by a theoretical approximation of the temperature response of the first and second oscillators.

At 502, an offset between the compensated frequency and the received frequency, for example a frequency of the GNSS signal, may be determined.

At 503, the model may be updated to take into account these new data points.

After 503, the method 500 may loop back to 502 where more measurements may be performed. It will be appreciated that these measurements may be performed periodically or at certain times specific to the receiver 400.

In one example, the offset 407 at the determined temperature of the first and second oscillator forms a data point and is recorded. One or more data points may be used to update the model. In some embodiments, a data point may be recorded about every 1 minute but it could be on any time scale dependent on the system implemented. A balance is to have a time period allowing for the temperature to change while still capturing data (the offset 407) at key temperature points. In some embodiments, the time period may be a range from 10 second to 1 minute. In some cases, there is some degradation in performance over the lifetime of the crystal oscillator. In some embodiments, this may be accounted for an algorithm for updated the model configured to forget the long term history of the data points. For example, the algorithm may only take into account the N last data points.

One way of using data points to update the amount of compensation applied to a frequency is to store the data points in a table and reference them. For example, the data points giving an error in the non-ideal component determination may be used to adjust the determination of the model by looking up an adjustment value in the table. However the use of such a table is potentially inaccurate and may take up extra space in memory as well as additional computational steps.

Alternatively, the model may be implemented by a real-time, recursive algorithm in which data points are input to the model and cause the model coefficients to be updated. In this case, no table of data points need be stored. In such algorithms the data points may be filtered, resulting in an update of the coefficients of the filter.

Such an algorithm may be for example a linear quadratic estimation algorithm or a Kalman filter. In this case, the Kalman filter or linear quadratic estimation may be used to provide a model defined by coefficients. The coefficients of the model may describe the behavior of an oscillator frequency with regards to the temperature of the oscillator.

In the initial model, the coefficients may describe a not entirely accurate approximation of the behavior. The Kalman filter may provide an algorithm that accepts a series of data points comprising the determined temperature and offset and use these data points to provide more accurate estimations of the coefficients. The Kalman filter of embodiments may operate recursively and process each data point as it is generated. In other words, in an embodiment, the data points need not be stored in a table, but may be processed by the Kalman filter to update the coefficients as the data points are generated. The Kalman filter may operate recursively.

The initial model may in some embodiments, be the models 203 and 201. In other embodiments the model may be a combined model of 201 and 203.

In the foregoing reference has been made to a temperature response of the first and second oscillators and for example shown in the plot of FIG. 2. It will be appreciated that in embodiments, the temperature response may be given by the frequency difference of the frequency in parts per million (ppm) vs. temperature. In some embodiments, the ideal component of the first frequency may be used as the reference for the ppm. For example the temperature response of the first oscillator may be the non-deal component of the first frequency in ppm of the ideal component of the first frequency. The temperature response of the second oscillator may be the difference between the second frequency and an ideal component of the first frequency in ppm of the ideal component of the first frequency. The combined response 203 may for example be the difference between the second and first frequencies in ppm of the ideal component of the first frequency.

It will be appreciated that in some embodiments, the ideal component of the first frequency may not be available (for example the navigation signal 405 may not have been acquired) when measuring the difference between the first frequency and the second frequency. In this case the non-ideal component of the first frequency may be disregarded in the conversion to ppm and this difference may be given in ppm of the first frequency. The model 203 may be updated in the second phase to take into account any error incurred due to the non-ideal component of the first frequency in the ppm calculation.

It will also be appreciated that this is by way of example only and other reference frequencies may be used for the ppm calculation in some embodiments.

It will be appreciated that in some embodiments, the first oscillator may not be configured to generate a first frequency that matches the frequency of the GNSS signal but rather be configured to generate a frequency that is a factor thereof. The oscillator hardware may be configured to scale this generated frequency to correspond to the frequency of the received signal. It will be appreciated that in some embodiments, the oscillator may generate the frequency of the received signal without any scaling.

It will be appreciated that the apparatus 100 and/or receiver 400 may be implemented as part of an integrated circuit die. For example the apparatus 100 may form part of a single integrated package. For example the circuitry of the apparatus 100 may be provided as a single integrated circuit die and may output a compensated first frequency to further circuitry and or integrated die that may make use of the first frequency.

In the foregoing an example of a GNSS receiver is given however it will be appreciated that embodiments may be applicable to any device or apparatus wherein the accuracy of a frequency may be of use. For example in some embodiments the apparatus 100 may be provided as an oscillator that provides temperature compensation, for example in the place of a temperature controlled crystal oscillator (TXCO).

In the foregoing, a frequency of the first and the second oscillators has been given as 26 MHz and 32 kHz respectively, however it will be appreciated that this is by way of example only and the oscillators may be configured to generate different frequencies. In this example the temperature responses of the first and second oscillators may differ due to mechanical structure and frequency, however it will be appreciated that oscillators that have differing temperature responses due to other reasons may be implemented. Any oscillators may be implemented with temperature responses that differ sufficiently such that an operational temperature of the oscillators may be determined from a difference between the frequencies (or non-ideal components of the frequencies) generated by the oscillators. For example this may be due to a difference between the frequencies corresponding to an unique temperature due to the difference in the temperature responses of the oscillators.

An appropriately adapted computer program code product or products may be used for implementing the embodiments, when loaded on an appropriate data processing apparatus, for example for compensating the frequency for error. The program code product for providing the operation may be stored on, provided and embodied by means of an appropriate carrier medium. An appropriate computer program can be embodied on a computer readable record medium. A possibility is to download the program code product via a data network. In general, the various embodiments may be implemented in hardware or special purpose circuits, software, logic or any combination thereof. Embodiments may thus be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

It is also noted herein that while the above describes exemplifying embodiments, there are several variations and modifications which may be made to the disclosed embodiments without departing from the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An apparatus, comprising:
a first oscillator configured to generate a first frequency;
a second oscillator configured to generate a second frequency; and
control circuitry configured to:
determine a difference between the first frequency and the second frequency;

determine a non-ideal component of the first frequency based on the difference and a frequency compensation model;

adjust the first frequency based on the determined non-ideal component of the first frequency; and revise the frequency compensation model based on the adjusted first frequency and a reference frequency.

2. The apparatus of claim 1 wherein the frequency compensation model is based on a temperature response of the first and second oscillators.

3. The apparatus of claim 1 wherein the frequency compensation model is based on a relationship between a difference between the first and second frequencies and an operational temperature of the first and second oscillators.

4. The apparatus of claim 1 wherein the first and second oscillators have respective temperature responses such that at any temperature in an operational temperature range of the apparatus, a difference between the first and second frequencies corresponds to a unique temperature.

5. The apparatus of claim 1 wherein the first frequency comprises an ideal component and the non-ideal component.

6. The apparatus of claim 1 wherein the second frequency comprises an ideal component and a non-ideal component.

7. The apparatus of claim 1 wherein the control circuitry is configured to output the adjusted first frequency.

8. A method, comprising:
generating a first frequency using a first oscillator;
generating a second signal using a second oscillator;
determining a difference between the first frequency and the second frequency;
determining a non-ideal component of the first frequency based on the difference and a frequency compensation model;
adjusting the first frequency based on the determined non-ideal component of the first frequency; and
revising the frequency compensation model based on the adjusted first frequency and a reference frequency.

9. The method of claim 8 wherein the frequency compensation model is based on a relationship of respective frequencies generated by the first and second oscillators with an operational temperature of the first and second oscillators.

10. The method claim 8 wherein the frequency compensation model is based on a relationship between a difference between the first and second frequencies and the operational temperature of the first and second oscillators.

11. The method claim 8 wherein the first and second oscillators have respective temperature responses such that at any temperature in an operational temperature range of the apparatus, a difference between the first and second frequencies corresponds to a unique temperature.

12. The method of claim 8 wherein the first frequency comprises an ideal component and the non-ideal component.

13. The method of claim 8 wherein the second frequency comprises an ideal component and a non-ideal component.

14. A system, comprising:
a first oscillator configured to generate a first frequency;
a second oscillator configured to generate a second frequency;
frequency control circuitry configured to:
determine a difference between the first frequency and the second frequency;
determine a non-ideal component of the first frequency based on the difference and a frequency compensation model;
adjust the first frequency based on the determined non-ideal component of the first frequency; and
revise the frequency compensation model based on the adjusted first frequency and a reference frequency; and
operational circuitry configured to receive the adjusted first frequency.

15. The system of claim 14 wherein the frequency compensation model is based on a relationship of respective frequencies generated by the first and second oscillators with an operational temperature of the first and second oscillators.

16. The system of claim 14 wherein the operational circuitry comprises a global satellite navigation system receiver including acquisition and tracking circuitry configured to receive a navigation signal.

17. The system of claim 14 comprising an integrated circuit, the integrated circuit including the first oscillator, the second oscillator and the frequency control circuitry.

18. The system of claim 17 wherein the integrated circuit comprises the operational circuitry and the operational circuitry includes a global satellite navigation system receiver.

19. A non-transitory computer-readable medium having contents which configure circuitry to perform a method, the method comprising:
determining a difference between a first frequency generated by a first oscillator and a second frequency generated by a second oscillator;
determining a non-ideal component of the first frequency based on the difference and a frequency compensation model;
adjusting the first frequency based on the determined non-ideal component of the first frequency; and
revising the frequency compensation model based on the adjusted first frequency and a reference frequency.

20. The non-transitory computer-readable medium of claim 19 wherein the frequency compensation model is based on a relationship of respective frequencies generated by the first and second oscillators with an operational temperature of the first and second oscillators.

21. The apparatus of claim 1 wherein the reference frequency is a frequency of a received signal and the revising the frequency compensation model comprises comparing the frequency of the received signal to the adjusted first frequency.

22. The apparatus of claim 1 wherein the reference frequency is a frequency of a navigation signal.

23. The apparatus of claim 1 wherein the revising the frequency compensation model comprises periodically updating the frequency compensation model.

24. The method of claim 8 wherein the reference frequency is a frequency of a received signal and the revising the frequency compensation model comprises comparing the frequency of the received signal to the adjusted first frequency.

25. The method of claim 8 wherein the reference frequency is a frequency of a navigation signal.

26. The method of claim 8 wherein the revising the frequency compensation model comprises periodically updating the frequency compensation model.

* * * * *